US008242371B2

(12) United States Patent
Shin et al.

(10) Patent No.: US 8,242,371 B2
(45) Date of Patent: Aug. 14, 2012

(54) HEAT DISSIPATING CIRCUIT BOARD AND METHOD OF MANUFACTURING THE SAME

(75) Inventors: Hye Sook Shin, Gyunggi-do (KR); Seog Moon Choi, Seoul (KR); Shan Gao, Gyunggi-do (KR); Chang Hyun Lim, Seoul (KR); Tae Hyun Kim, Seoul (KR); Young Ki Lee, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 262 days.

(21) Appl. No.: 12/614,405

(22) Filed: Nov. 7, 2009

(65) Prior Publication Data
US 2011/0067902 A1 Mar. 24, 2011

(30) Foreign Application Priority Data
Sep. 23, 2009 (KR) .................. 10-2009-0090162

(51) Int. Cl.
*H05K 7/20* (2006.01)
*H05K 1/00* (2006.01)
(52) U.S. Cl. ........ 174/252; 174/255; 174/256; 174/257; 174/262; 361/679.46; 361/679.53; 361/704; 361/720; 361/722; 29/846; 257/675; 257/698; 257/700; 257/706; 257/707; 257/701
(58) Field of Classification Search .......... 174/252–267; 257/675, 677, 686, 698, 700–727, E23.006, 257/E23.004, E23.009, E23.062; 361/679.46, 361/679.53, 688, 719–723; 428/209, 432; 438/106–118, 611–613; 29/825–852; 216/17
See application file for complete search history.

(56) References Cited

U.S. PATENT DOCUMENTS

| RE29,784 | E | * | 9/1978 | Chadwick et al. | ............ 174/252 |
| 4,495,378 | A | * | 1/1985 | Dotzer et al. | ................. 174/252 |
| 4,769,270 | A | * | 9/1988 | Nagamatsu et al. | ......... 428/131 |
| 4,794,048 | A | * | 12/1988 | Oboodi et al. | ................ 428/432 |

(Continued)

FOREIGN PATENT DOCUMENTS
KR 1020050063689 6/2005
(Continued)

OTHER PUBLICATIONS

Office Action from counterpart Korean Patent Application No. 10-2009-0090162, Mar. 6, 2011, 4 pages.

*Primary Examiner* — Michail V Datskovskiy
(74) *Attorney, Agent, or Firm* — Blakely Sokoloff Taylor & Zafman LLP

(57) ABSTRACT

Disclosed is a heat dissipating circuit board, which includes a metal core including an insulating layer formed on the surface thereof, a circuit layer formed on the insulating layer and including a seed layer and a first circuit pattern, and a heat dissipating frame layer bonded onto the circuit layer using solder and having a second circuit pattern, and in which the heat dissipating frame layer is bonded onto the circuit layer not by a plating process but by using solder, thus reducing the cost and time of the plating process and relieving stress applied to the heat dissipating circuit board due to the plating process. A method of manufacturing the heat dissipating circuit board is also provided.

6 Claims, 9 Drawing Sheets

U.S. PATENT DOCUMENTS

| | | | | |
|---|---|---|---|---|
| 4,882,454 | A * | 11/1989 | Peterson et al. | 174/252 |
| 5,914,861 | A * | 6/1999 | Richter et al. | 361/720 |
| 6,744,135 | B2 * | 6/2004 | Hasebe et al. | 257/712 |
| 6,869,664 | B2 * | 3/2005 | Vasoya et al. | 428/209 |
| 7,038,142 | B2 * | 5/2006 | Abe | 174/255 |
| 7,199,457 | B2 * | 4/2007 | Ogawa | 257/684 |
| 7,540,969 | B2 * | 6/2009 | Ho et al. | 216/17 |
| 7,663,226 | B2 * | 2/2010 | Cho et al. | 257/701 |
| 7,683,266 | B2 * | 3/2010 | Shibata et al. | 174/262 |
| 7,783,141 | B2 * | 8/2010 | Kodama et al. | 385/14 |
| 7,875,340 | B2 * | 1/2011 | Cho et al. | 428/209 |
| 2003/0136577 | A1 * | 7/2003 | Abe | 174/255 |
| 2007/0126112 | A1 * | 6/2007 | Cho et al. | 257/700 |
| 2008/0047742 | A1 * | 2/2008 | Samejima et al. | 174/257 |

FOREIGN PATENT DOCUMENTS

| | | |
|---|---|---|
| KR | 100787089 B1 | 12/2007 |
| KR | 1020090094983 | 9/2009 |

* cited by examiner

HEAT DISSIPATING CIRCUIT BOARD AND METHOD OF MANUFACTURING THE SAME

CROSS REFERENCE TO RELATED APPLICATION

This application claims the benefit of Korean Patent Application No. 10-2009-0090162, filed Sep. 23, 2009, entitled "A radiant heat circuit board and a method of manufacturing the same", which is hereby incorporated by reference in its entirety into this application.

BACKGROUND OF THE INVENTION

1. Technical Field

The present invention relates to a heat dissipating circuit board and a method of manufacturing the same.

2. Description of the Related Art

Alongside the recent advancement of the electronics industry is a drastically increasing demand for electronic parts with increased functionality. Circuit boards which mount electronic parts which are lightweight, slim, short and small should be able to integrate many electronic products on a small area of the circuit board.

Meanwhile, provided on the circuit board is a heating device such as a semiconductor device or a light emitting diode. However, this device emits a very large amount of heat. If heat generated by the heating device does not rapidly dissipate, the temperature of the circuit board increases, undesirably causing operation of the heating device to become impossible and the heating device to operate improperly. Thus, circuit boards having improved heat dissipation properties are being researched.

FIG. 1 is a cross-sectional view showing a conventional heat dissipating circuit board. With reference to FIG. 1, the heat dissipating circuit board and the method of manufacturing the same are described below.

First, a metal core 11 is subjected to for example anodizing treatment which forms an insulating layer 12 on both surfaces thereof.

Next, a plating process and an etching process are performed on the insulating layer 12, thus forming a circuit layer 13.

Next, a heating device (not shown) is disposed on the circuit layer 13, and the circuit layer 13 and the heating device (not shown) are bonded to each other using wire or solder.

The conventional heat dissipating circuit board is thus manufactured through the above procedures.

In the case of the conventional heat dissipating circuit board, because the metal is very effective in terms of transferring heat, heat generated from the heating device (not shown) is dissipated to the outside through the insulating layer 12 and the metal core 11. Thus, an electronic device formed on the heat dissipating circuit board is not subjected to comparatively high heat, and problems of the performance of the electronic device getting reduced are solved to some degree.

However, in the case of the conventional heat dissipating circuit board, the circuit layer 13 should be formed thick so as to maximize heat dissipation effects. Because the circuit layer 13 is formed on the insulating layer 12 by a plating process, the formation of the thick circuit layer 13 undesirably results in increased plating process time and cost.

Furthermore, as the process time is prolonged, stress applied to the heat dissipating circuit board due to the plating process is undesirably enhanced.

SUMMARY OF THE INVENTION

Accordingly, the present invention has been made keeping in mind the problems encountered in the related art and the present invention is intended to provide a heat dissipating circuit board in which a thick heat dissipating frame layer is bonded onto a circuit layer not by a plating process but by using solder thus reducing the plating process time and cost, and also to provide a method of manufacturing the same.

Also the present invention is intended to provide a heat dissipating circuit board in which the plating process time is shortened thus relieving stress applied to the heat dissipating circuit board, and also to provide a method of manufacturing the same.

An aspect of the present invention provides a heat dissipating circuit board, including a metal core including an insulating layer formed on a surface thereof, a circuit layer formed on the insulating layer and including a seed layer and a first circuit pattern, and a heat dissipating frame layer bonded onto the circuit layer using solder and having a second circuit pattern.

In this aspect, the metal core may include aluminum (Al), and the insulating layer formed on the surface of the metal core may include $Al_2O_3$.

In this aspect, the metal core may further include a through hole which is formed in the metal core and which is plated at an inner surface thereof to be connected to the circuit layer, and the insulating layer is formed in the through hole as well as on the surface of the metal core.

In this aspect, the heat dissipating frame layer may have a thickness equal to or greater than tens of μm.

In this aspect, the second circuit pattern may be formed to be the same as the first circuit pattern.

Alternatively, the second circuit pattern may be formed to be different from the first circuit pattern.

Another aspect of the present invention provides a method of manufacturing the heat dissipating circuit board, including (A) forming an insulating layer on a surface of a metal core, (B) forming a circuit layer including a seed layer and a first circuit pattern on the insulating layer, (C) preparing a heat dissipating frame layer having a second circuit pattern, and (D) bonding the heat dissipating frame layer onto the circuit layer using solder.

In this aspect, in (C), the heat dissipating frame layer may have a thickness equal to or greater than tens of μm.

In this aspect, (A) may include (A1) preparing a metal core comprising aluminum and (A2) anodizing the metal core thus forming an insulating layer comprising $Al_2O_3$.

In this aspect, in (C), the second circuit pattern may be formed to be the same as the first circuit pattern.

Alternatively, in (C), the second circuit pattern may be formed to be different from the first circuit pattern.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
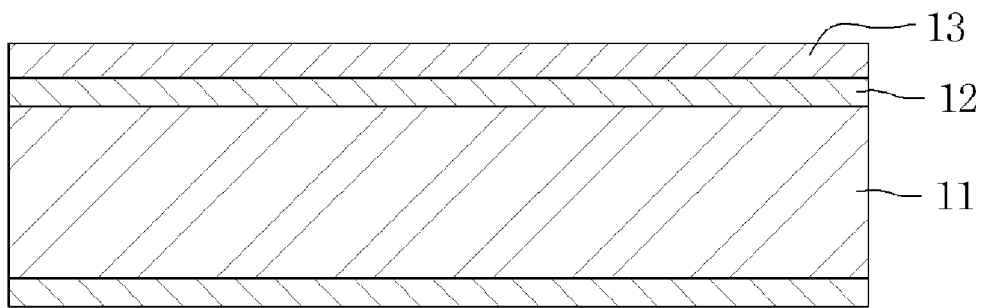
FIG. 1 is a cross-sectional view showing a conventional heat dissipating circuit board.

Hereinafter, embodiments of the present invention will be described in detail while referring to the accompanying drawings. Throughout the drawings, the same reference numerals are used to refer to the same or similar elements. In the description, the terms "first", "second" and so on are used only to distinguish one element from another element, and the elements are not defined by the above terms. Furthermore, descriptions of known techniques, even if they are pertinent to the present invention, are regarded as unnecessary and may be omitted in so far as they would make the characteristics of the invention unclear and muddy the description.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Heat Dissipating Circuit Board

Figure 2:
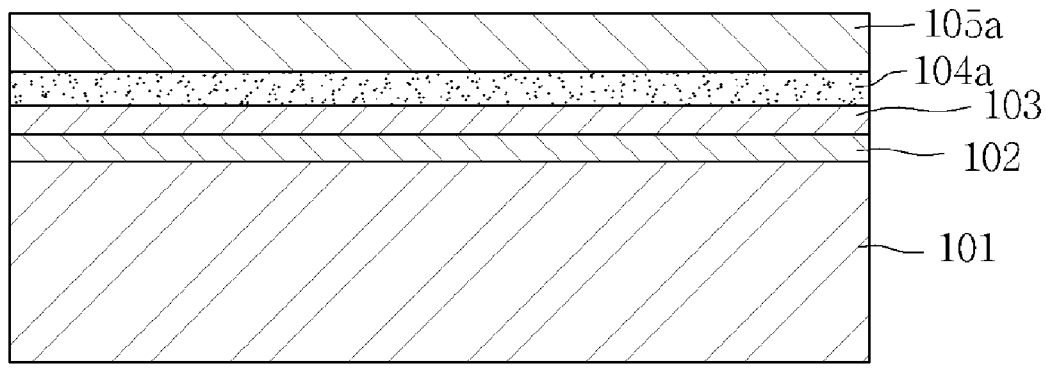
FIG. 2 is a cross-sectional view showing a heat dissipating circuit board according to a first embodiment of the present invention.
Figure 3:
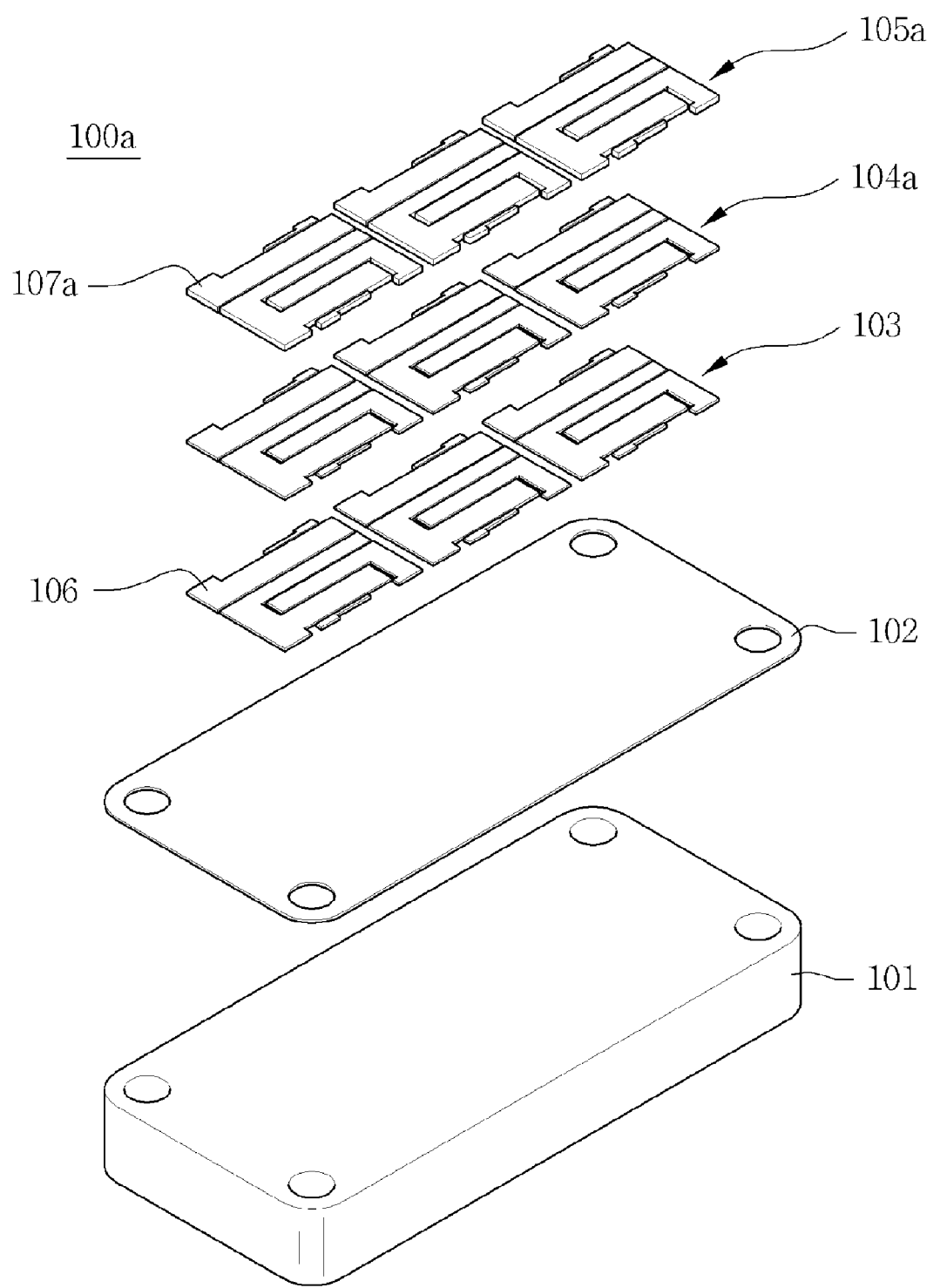
FIG. 3 is an exploded perspective view showing the heat dissipating circuit board of FIG. 2.

FIG. 2 is a cross-sectional view showing a heat dissipating circuit board 100a according to a first embodiment of the present invention, and FIG. 3 is an exploded perspective view showing the heat dissipating circuit board of FIG. 2. With reference to these drawings, the heat dissipating circuit board 100a according to the present embodiment is described below.

As shown in FIGS. 2 and 3, the heat dissipating circuit board 100a according to the present embodiment is configured such that a heat dissipating frame layer 105a is formed on an insulating layer 102 not through direct plating but by using solder 104a, thus exhibiting high heat dissipation properties.

Specifically, the insulating layer 102 is formed on a metal core 101, and a circuit layer 103 including a seed layer is formed on the insulating layer 102 through plating. Further, the heat dissipating frame layer 105a is bonded onto the circuit layer 103 using solder 104a. Although FIGS. 2 and 3 illustrate the formation of the insulating layer 102, the circuit layer 103 and the heat dissipating frame layer 105a only on one surface of the metal core 101, the present invention is not limited thereto. The insulating layer 102, the circuit layer 103 and the heat dissipating frame layer 105a may be formed on both surfaces of the metal core 101.

The metal core 101 which functions to improve heat dissipation properties may be made of aluminum. As such, the insulating layer 102 may be made of $Al_2O_3$ formed by anodizing aluminum. Further, a through hole (not shown) may be formed in the metal core 101, and the inner surface of the through hole (not shown) is plated so that circuit layers 103 formed on both surfaces of the metal core 101 may be connected to each other.

The circuit layer 103 is formed on the insulating layer 102. The circuit layer 103 may include a seed layer and a plating layer formed on the seed layer. According to the present invention, because the heat dissipating frame layer 105a is separately provided through a subsequent procedure, the circuit layer 103 which is formed by a plating process may be formed thin compared to the conventional technique. The circuit layer 103 may have a thickness ranging from ones to tens of μm. In the case where the circuit layer 103 is formed to be thicker than tens of μm, high stress may be undesirably applied to the heat dissipating circuit board 100a.

The heat dissipating frame layer 105a is formed in such a manner that it is bonded onto the circuit layer 103 using the solder 104a in a state in which a second circuit pattern 107a has been formed thereon, unlike in the conventional technique which forms it to be thick through direct plating on an insulating layer. The heat dissipating frame layer 105a is formed of the same metal as was used for the circuit layer 103 and has a thickness equal to or greater than tens of μm in order to improve heat dissipation properties. In the case where the heat dissipating frame layer 105a is formed much thicker than the circuit layer 103, heat generated from a heating device (not shown) mounted on the heat dissipating frame layer 105a may be rapidly transferred to the outside of the metal core 101 or the heat dissipating circuit board 100a via the heat dissipating frame layer 105a.

The solder 104a functions to bond the heat dissipating frame layer 105a and the circuit layer 103 to each other so that heat generated from the heating device (not shown) is transferred to the metal core 101, and also functions to electrically connect the heat dissipating frame layer 105a and the circuit layer 103 to each other so that the heat dissipating frame layer 105a plays a role as a circuit pattern. The material used for the solder 104a may include any bonding metal which is typically known in the art, for example, a metal such as soft solder having a low melting point.

In the present embodiment, the first circuit pattern 106 of the circuit layer 103 and the second circuit pattern 107a of the heat dissipating frame layer 105a are formed in the same shape. Thus, the heating device (not shown) may be situated on any pattern where the first circuit pattern 106 is formed, and heat generated from the heating device (not shown) may be transferred to the metal core 101 via the heat dissipating frame layer 105a, the solder 104a, and the circuit layer 103 in this sequential order.

The solder 104a is disposed under the heat dissipating frame layer 105a and is not exposed in the final product. Hence, the pattern of the solder 104a is the same as the second circuit pattern 107a of the heat dissipating frame layer 105a, and may thus be the same as the first circuit pattern 106.

Figure 4:
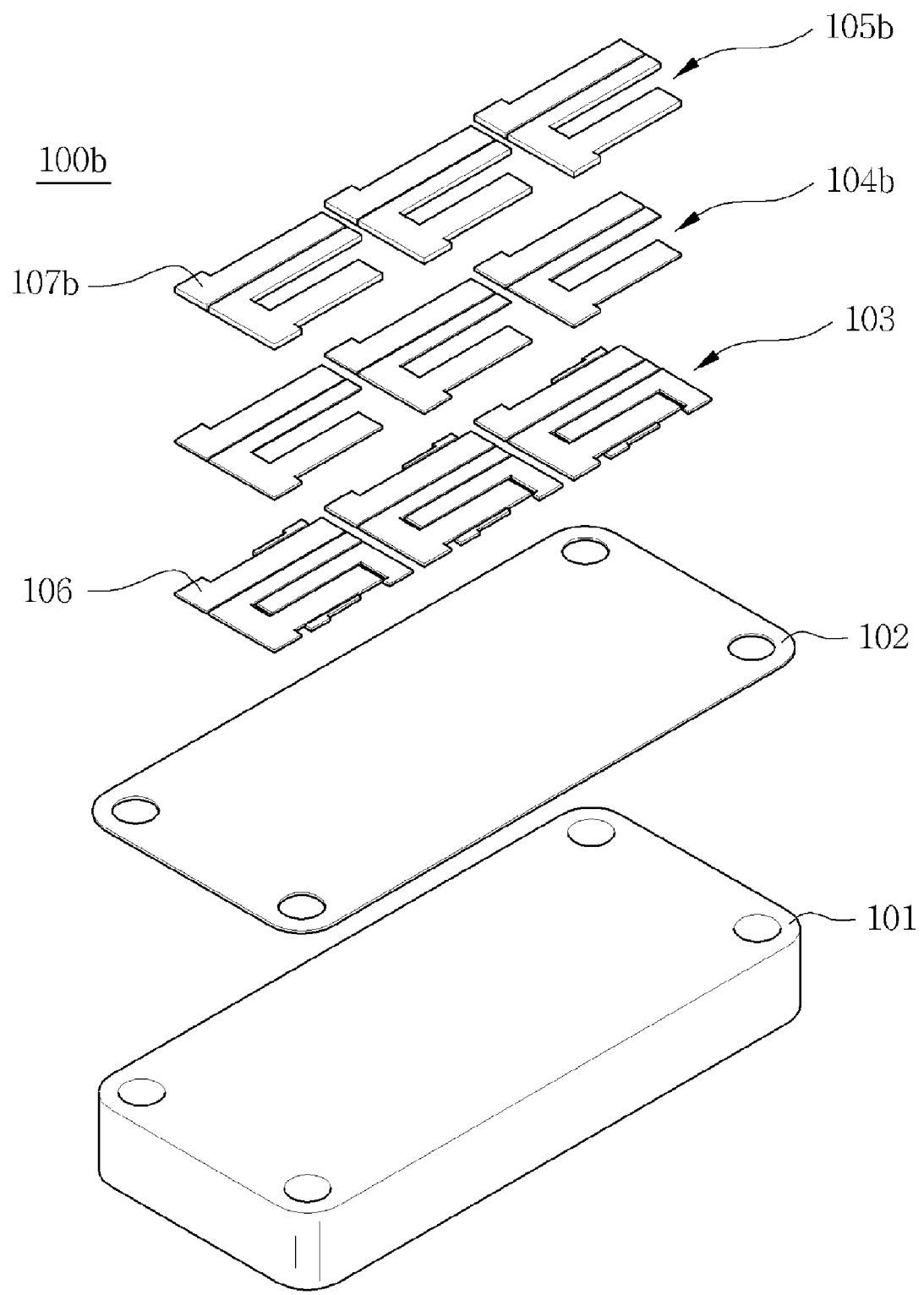
FIG. 4 is an exploded perspective view showing a heat dissipating circuit board according to a second embodiment of the present invention.

FIG. 4 is an exploded perspective view showing a heat dissipating circuit board 100b according to a second embodiment of the present invention. With reference to this drawing, the heat dissipating circuit board 100b according to the present embodiment is described below. In the description of the present embodiment, elements which are the same as or similar to those of the previous embodiment are designated by the same reference numerals, and redundant descriptions thereof are omitted.

As shown in FIG. 4, the heat dissipating circuit board 100b according to the present embodiment is configured such that an insulating layer 102 is formed on a metal core 101, a circuit layer 103 including a seed layer is formed on the insulating layer 102 by a plating process, and a heat dissipating frame layer 105b is bonded onto the circuit layer 103 using solder 104b, in which the first circuit pattern 106 of the circuit layer 103 is different from the second circuit pattern 107b of the heat dissipating frame layer 105b.

Specifically, the first circuit pattern 106 is formed to be different from the second circuit pattern 107b, but the second circuit pattern 107b may be formed to be the same as part of the first circuit pattern 106. Thus, the heat dissipating frame layer 105b is bonded only to a position where a heating device (not shown) is disposed on the circuit layer 103, thus reducing the processing time and cost.

The pattern formed on the solder 104b is the same as the second circuit pattern 107b, and thus may be formed to be the same as part of the first circuit pattern 106 as in the second circuit pattern 107b.

Method of Manufacturing Heat Dissipating Circuit Board

With reference to FIGS. 5 to 8, the method of manufacturing the heat dissipating circuit board 100a according to the first embodiment of the present invention is described below.

Figure 5:
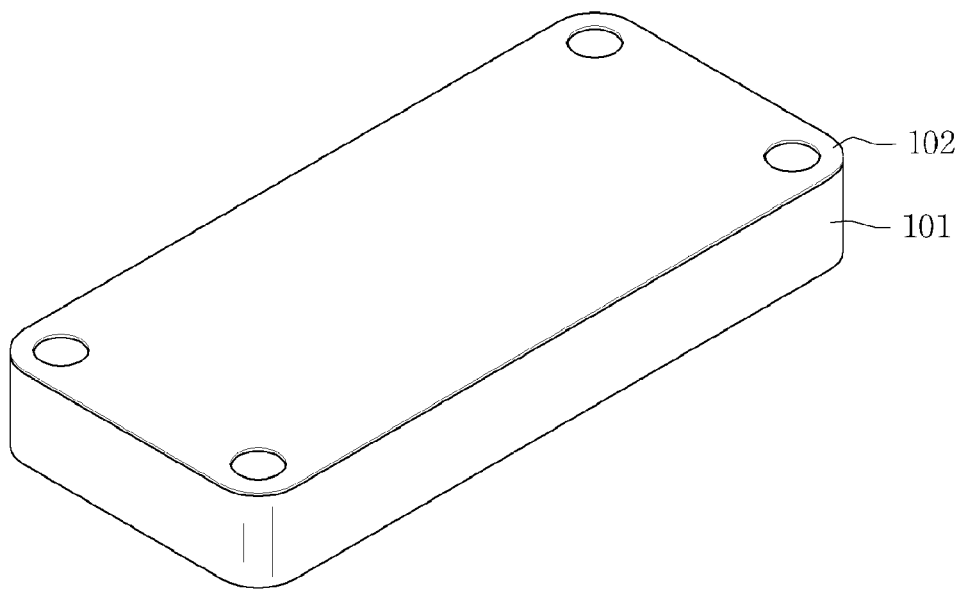
FIGS. 5 to 8 are perspective views sequentially showing a process of manufacturing the heat dissipating circuit board of FIG. 2.

First, as shown in FIG. 5, an insulating layer 102 is formed on the surface of a metal core 101. Although FIG. 5 illustrates the formation of the insulating layer 102 only on the upper surface of the metal core 101, the insulating layer 102 may be formed on the entire surface of the metal core 101.

As such, the metal core 101 may be made of aluminum, and the insulating layer 102 may be made of $Al_2O_3$ resulting from anodizing the metal core 101. In the case where the metal core 101 is made of aluminum, heat dissipation properties of the heat dissipating circuit board 100a may be effectively improved.

Figure 6:
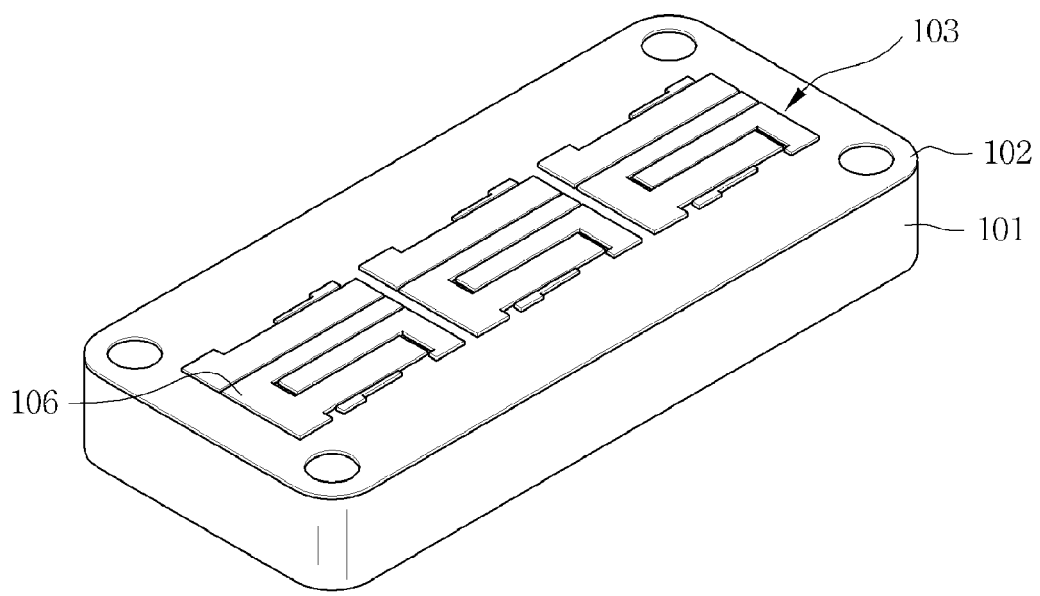

Next, as shown in FIG. 6, a circuit layer 103 including a seed layer and a first circuit pattern 106 is formed on the insulating layer 102.

Specifically, for example, an electroless plating process or a sputtering process is performed on the insulating layer 102, thus forming the seed layer. As such, the seed layer facilitates the bonding between the plating layer and the insulating layer 102, so that the circuit layer 103 is easily bonded onto the insulating layer 102.

After the formation of the seed layer, the circuit layer 103 is formed on the seed layer. The first circuit pattern 106 of the circuit layer 103 is formed by a plating process and an etching process. Particularly useful is a typically known process, for example, a subtractive process, an additive process, a semi-additive process, or a modified semi-additive process. The circuit layer 103 may have a thickness ranging from ones to tens of μm. In the case where the circuit layer 103 is formed thicker than tens of μm, stress applied to the heat dissipating circuit board 100a may be enhanced through a plating process for a long period of time.

Figure 7:
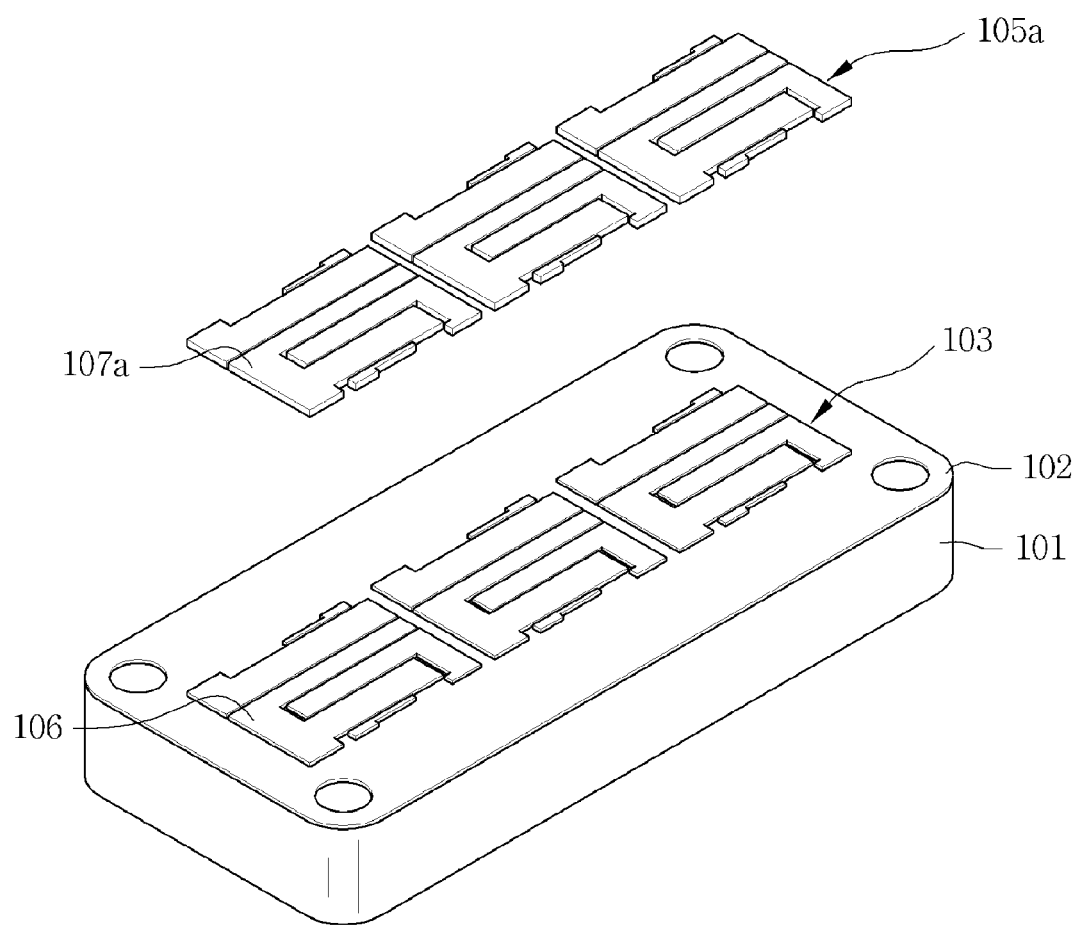

Next, as shown in FIG. 7, a heat dissipating frame layer 105a having a second circuit pattern 107a is prepared.

The heat dissipating frame layer 105a may be separately manufactured to have a predetermined pattern shape using a typical process known in the art without particular limitation. Also, in order to improve heat dissipation properties of the heat dissipating frame layer 105a, it is desirable that the heat dissipating frame layer 105a be formed at a thickness equal to or greater than tens of μm. Because the thick heat dissipating frame layer 105a is not formed on the insulating layer 102 through direct plating, stress directly applied to the heat dissipating circuit board due to the plating process may be avoided.

The second circuit pattern 107a of the heat dissipating frame layer 105a may be formed to be the same as the first circuit pattern 106 of the circuit layer 103.

Figure 8:
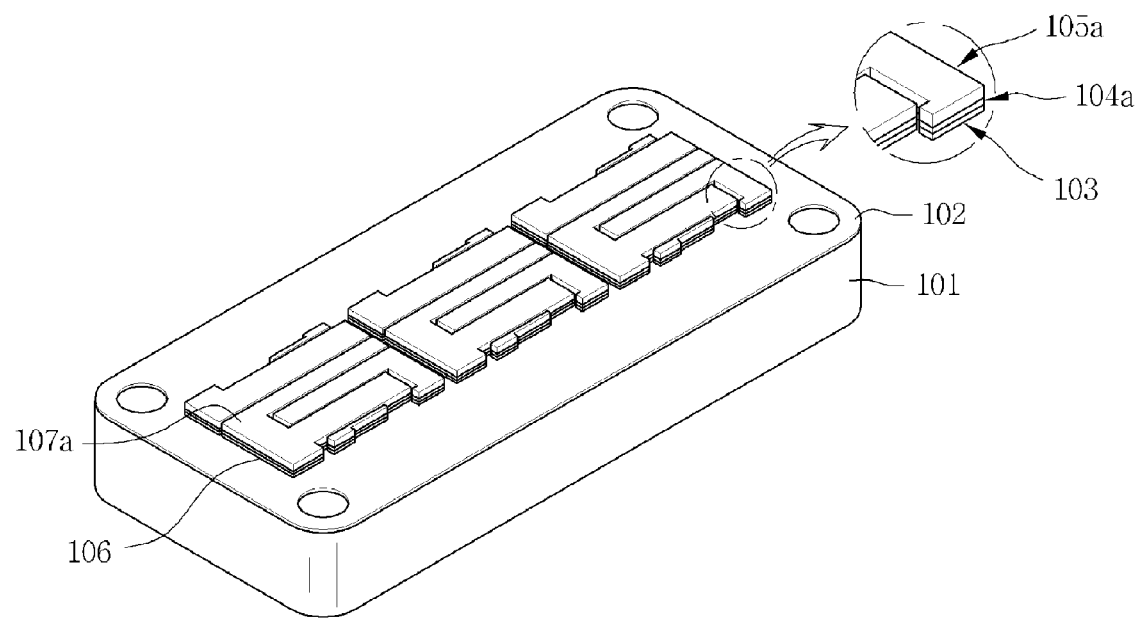

Next, as shown in FIG. 8, the heat dissipating frame layer 105a is bonded onto the circuit layer 103 using solder 104a.

The material of the solder 104a may include any metal, in particular, soft solder. In the case of soft solder, it has a low melting point, and thus a bonding process using the solder 104a may be carried out at low temperature and stress applied to the heat dissipating circuit board 100a may be relieved.

The pattern formed on the solder 104a may have the same shape as the second circuit pattern 107a. In this case, all of the pattern of the solder 104a, the first circuit pattern 106 and the second circuit pattern 107a may have the same shape.

The heat dissipating circuit board 100a according to the first embodiment, as shown in FIG. 8, may be manufactured by the above manufacturing process.

With reference to FIGS. 9 to 12, the method of manufacturing the heat dissipating circuit board 100b according to the second embodiment of the present invention is described below. In the description of the present embodiment, elements which are the same as or similar to those of the previous embodiment are designated by the same reference numerals, and redundant descriptions thereof are omitted.

Figure 9:
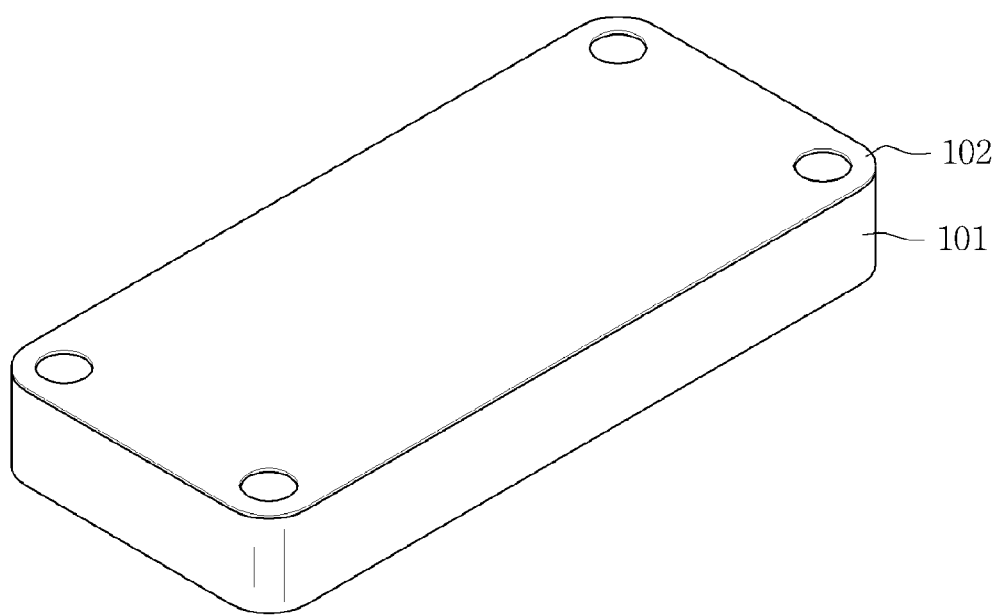
FIGS. 9 to 12 are perspective views sequentially showing a process of manufacturing the heat dissipating circuit board of FIG. 4.

First, as shown in FIG. 9, an insulating layer 102 is formed on a metal core 101.

Figure 10:
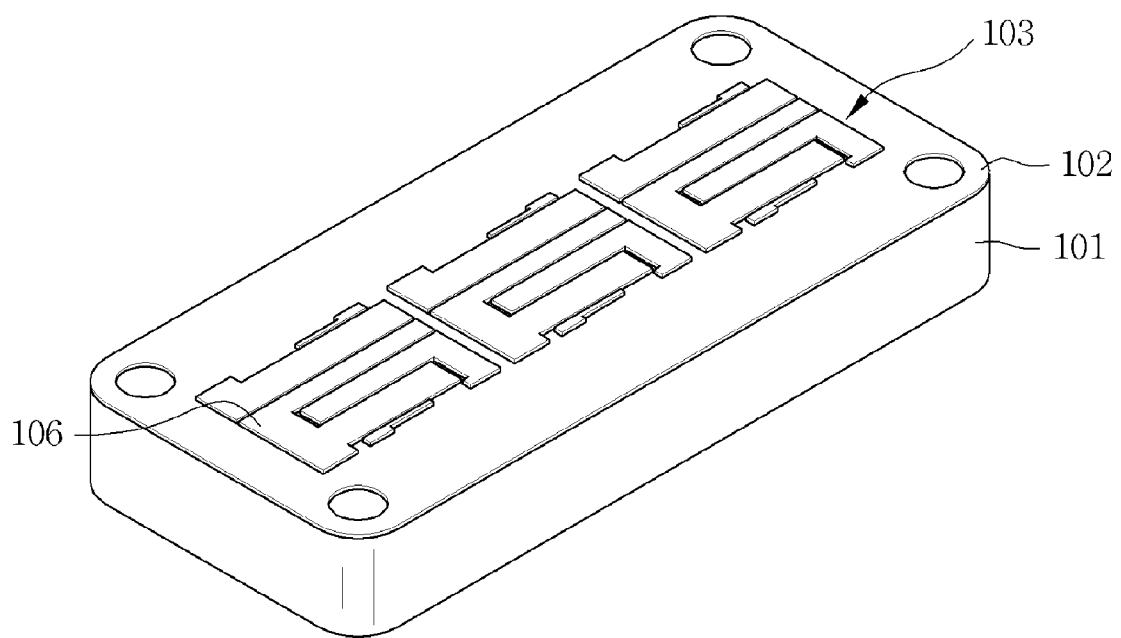

Next, as shown in FIG. 10, a circuit layer 103 including a seed layer and a first circuit pattern 106 is formed on the insulating layer 102.

Figure 11:
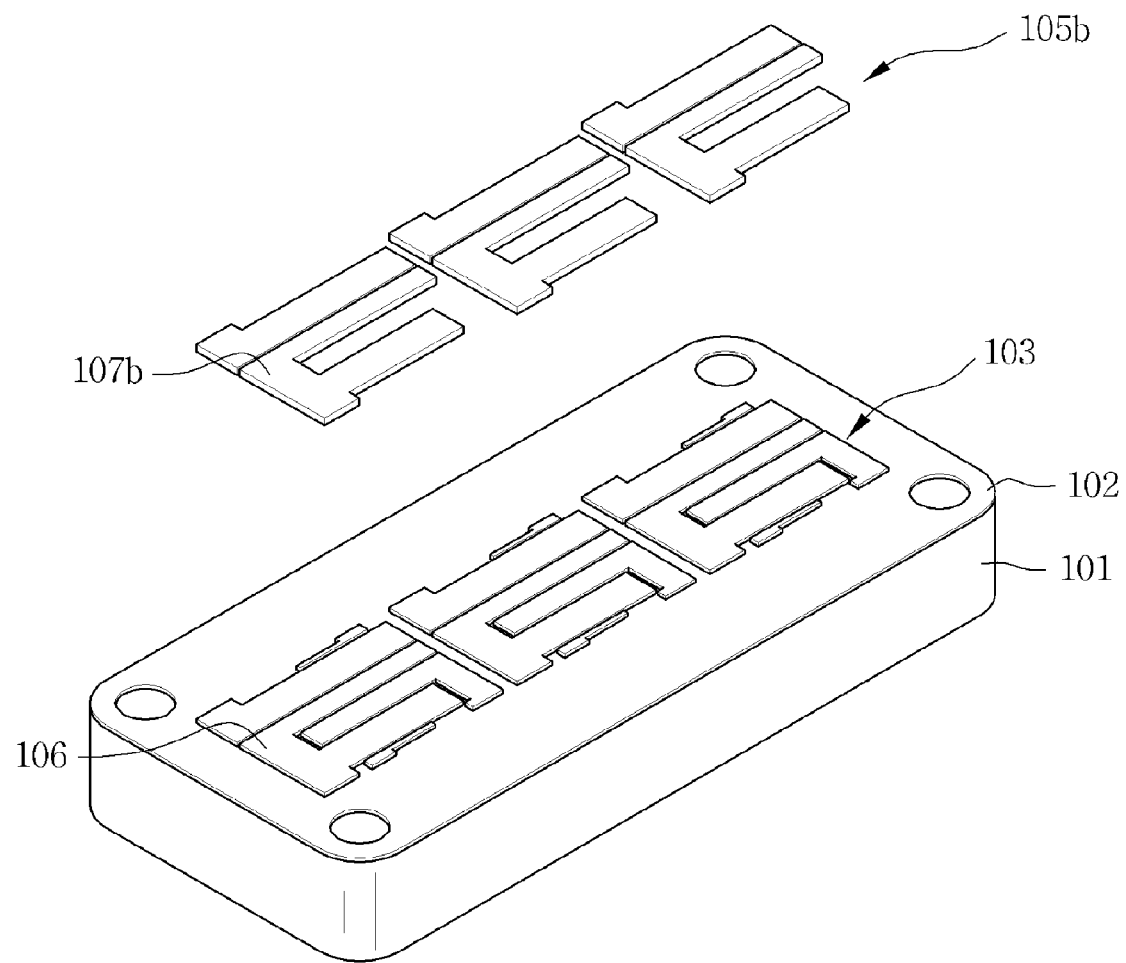

Next, as shown in FIG. 11, a heat dissipating frame layer 105b having a second circuit pattern 107b is prepared. As such, the second circuit pattern 107b and the first circuit pattern 106 are formed to be different from each other, and the second circuit pattern 107b may be formed to be the same as part of the first circuit pattern 106.

Figure 12:
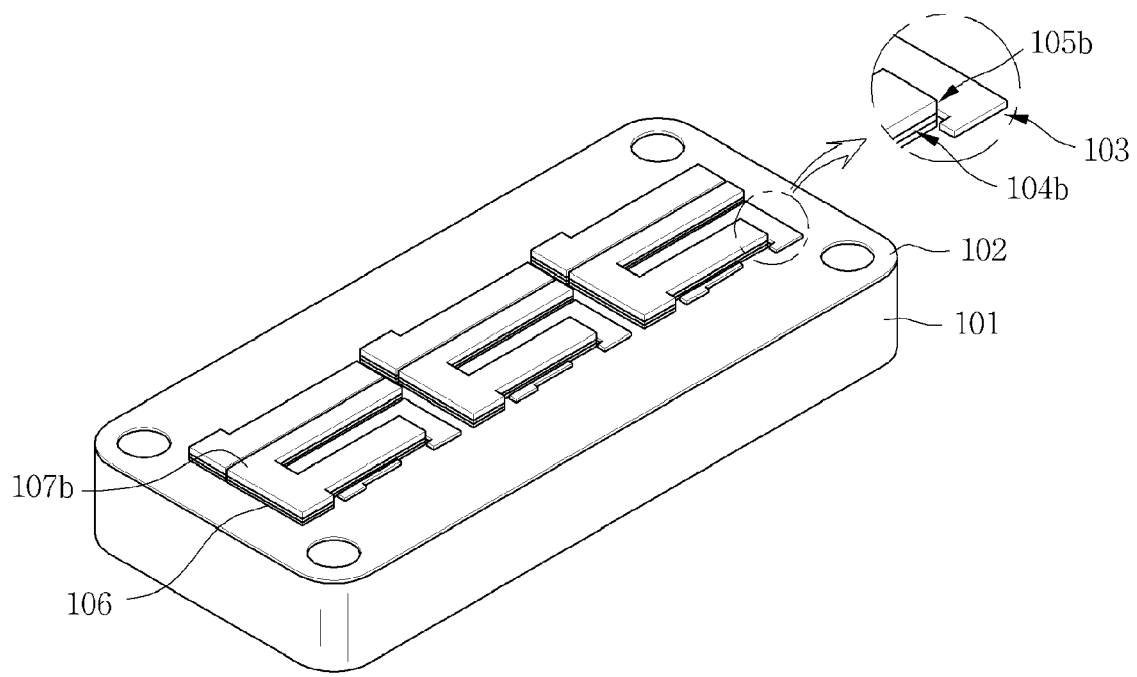

Next, as shown in FIG. 12, the heat dissipating frame layer 105b is bonded onto the circuit layer 103 using solder 104b. The pattern of the solder 104b may be the same as the second circuit pattern 107b. In this case, the pattern of the solder 104b is also different from the first circuit pattern 106 and may be formed to be the same as part of the first circuit pattern 106, as in the second circuit pattern 107b.

The heat dissipating circuit board 100b according to the second embodiment, as shown in FIG. 12, may be manufactured by the above manufacturing process.

As described hereinbefore, the present invention provides a heat dissipating circuit board and a method of manufacturing the same. According to the present invention, the heat dissipating circuit board is configured such that a circuit layer is formed to a thickness ranging from ones to tens of μm on an insulating layer, and a thick heat dissipating frame layer having a thickness equal to or greater than tens of μm is bonded onto the circuit layer using solder, thus reducing the plating process time and cost, thereby reducing the net time and cost required to manufacture the heat dissipating circuit board.

Also, according to the present invention, because the plating process time is reduced, stress applied to the heat dissipating circuit board during the plating process can be relieved.

Also, according to the present invention, a first circuit pattern of the circuit layer is formed to be the same as a second circuit pattern of the heat dissipating frame layer, thus improving heat dissipation effects and enabling a heating device to be disposed on any pattern where the first circuit pattern is formed.

Also, according to the present invention, the first circuit pattern and the second circuit pattern can be formed to be different from each other. As such, the second circuit pattern is formed to be the same as part of the first circuit pattern. Thereby, the heat dissipating frame layer is bonded only to a position where a heating device is disposed, thus reducing the cost required to manufacture the heat dissipating circuit board.

Also, according to the present invention, because the solder is made of metal, it can transfer heat emitted from the heat dissipating frame layer to the circuit layer, and also can electrically connect the heat dissipating frame layer and the circuit layer to each other so that the heat dissipating frame layer plays a role as a circuit pattern.

Although the embodiments of the present invention regarding the heat dissipating circuit board and the method of manufacturing the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A heat dissipating circuit board, comprising:
   a metal core including an insulating layer formed on a surface thereof;
   a circuit layer formed on the insulating layer and including a seed layer and a first circuit pattern; and
   a heat dissipating frame layer bonded onto the circuit layer using solder and having a second circuit pattern.

2. The heat dissipating circuit board as set forth in claim 1, wherein the metal core comprises aluminum (Al), and the insulating layer formed on the surface of the metal core comprises $Al_2O_3$.

3. The heat dissipating circuit board as set forth in claim 1, wherein the metal core further includes a through hole which is formed in the metal core and which is plated at an inner surface thereof to be connected to the circuit layer, and the insulating layer is formed in the through hole as well as on the surface of the metal core.

4. The heat dissipating circuit board as set forth in claim 1, wherein the heat dissipating frame layer has a thickness equal to or greater than tens of μm.

5. The heat dissipating circuit board as set forth in claim 1, wherein the second circuit pattern is formed to be same as the first circuit pattern.

6. The heat dissipating circuit board as set forth in claim 1, wherein the second circuit pattern is formed to be different from the first circuit pattern.

* * * * *